(12) United States Patent
Ugajin et al.

(10) Patent No.: US 6,871,057 B2
(45) Date of Patent: Mar. 22, 2005

(54) MIXER CIRCUIT

(75) Inventors: Mamoru Ugajin, Kanagawa (JP); Tsuneo Tsukahara, Kanagawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 776 days.

(21) Appl. No.: 09/799,035

(22) Filed: Mar. 6, 2001

(65) Prior Publication Data

US 2001/0021645 A1 Sep. 13, 2001

(30) Foreign Application Priority Data

Mar. 8, 2000 (JP) .......................... 2000-063485
Mar. 14, 2000 (JP) .......................... 2000-070318

(51) Int. Cl.[7] ................................. H04B 1/26
(52) U.S. Cl. ................... 455/323; 455/313; 455/333; 327/359
(58) Field of Search ................ 455/333, 323, 455/326, 311, 313, 314, 302, 318, 319, 324, 550.1, 118, 575.1; 327/359, 327, 113, 355; 330/296, 261, 311; 332/168, 178, 167–171, 117

(56) References Cited

U.S. PATENT DOCUMENTS

| | | | | |
|---|---|---|---|---|
| 5,448,772 A | | 9/1995 | Grandfield | 455/333 |
| 5,686,870 A | * | 11/1997 | Ariie | 332/168 |
| 5,999,804 A | * | 12/1999 | Forgues | 455/333 |
| 6,029,059 A | | 2/2000 | Bojer | 455/326 |
| 6,073,002 A | * | 6/2000 | Peterson | 455/326 |
| 6,094,084 A | * | 7/2000 | Abou-Allam et al. | 327/359 |
| 6,205,325 B1 | * | 3/2001 | Groe | 455/333 |
| 6,239,645 B1 | * | 5/2001 | Tsukahara et al. | 327/359 |
| 6,308,058 B1 | * | 10/2001 | Souetinov et al. | 455/326 |
| 6,611,680 B2 | * | 8/2003 | Litwin et al. | 455/311 |
| 6,639,447 B2 | * | 10/2003 | Manku et al. | 327/359 |

FOREIGN PATENT DOCUMENTS

| | | | |
|---|---|---|---|
| EP | 0 942 526 A1 | 9/1999 | |
| EP | 0 951 138 A1 | 10/1999 | |
| EP | 0 982 848 A1 | 3/2000 | |
| JP | 0982848 A1 * | 3/2000 | ............ H03D/7/14 |
| JP | 3067772 | 5/2000 | |

OTHER PUBLICATIONS

Behzad Razavi, RF Microelectronics, pp. 138–146, 1998.
Jan Crols et al., CMOS Wireless Transceiver Design, pp 178–181, 1997.
Mark D. McDonald, 1993 IEEE International Solid–State Circuits Conference, ISSCC 93/SESSION 9/. Radio Communication Circuits/Paper TP9.4, p. 3, p. 137, pp. 144–145, p. 279, Feb. 25, 1993.

* cited by examiner

Primary Examiner—Edward F. Urban
Assistant Examiner—Charles Chow
(74) Attorney, Agent, or Firm—Armstrong, Kratz, Quintos, Hanson & Brooks, LLP

(57) ABSTRACT

A mixer circuit used in a radio receiver for mixing two frequencies and providing an intermediate frequency which is the difference of the two frequencies. Excellent image rejection is provided by decreasing an amplitude error and a phase error of an output IF signal in differential form.

12 Claims, 16 Drawing Sheets

MIXER CIRCUIT

BACKGROUND OF THE INVENTION

1. Field of the Invention

The present invention relates to improvement of a mixer circuit used in a receiver in digital radio communication system, in particular, relates to such a circuit which is excellent in image rejection.

2. Description of the Related Art

FIG. 6 shows in general an image rejection mixer circuit, in which a received RF (radio frequency) signal is applied to a pair of multipliers 61 and 62, each of which receives further, a local signal LO, directly or through a 90° phase shifter 63, so that a product of RF and LO is obtained. Then, each multiplier provides a pair of output frequencies $F_{RF}+F_{LO}$ and $F_{RF}-F_{LO}$, where the former is an undesired frequency and the latter is a desired IF frequency. A product of each of the multipliers is applied to a low pass filter 64, 65, so that a pair of IF signals having a phase difference of 90° are obtained. Then, two IF signals are added in an adder 67 after one of the IF signals is shifted by 90° in a phase shifter 66, so that image rejection is carried out.

In a conventional image rejection mixer, a pair of multipliers and a 90° phase shifter are used, as shown in FIG. 6.

However, a prior art mixer shown in FIG. 6 has a disadvantage in that an image rejection in the GHz band is not enough as a 90° phase shifter with excellent performance in GHz band is difficult.

FIG. 7 is a conventional Gilbert-cell mixer, in which a radio frequency signal RF is applied to a pair of input transistors 71 and 72 located in a lower position in the figure. Therefore, an output signal amplitude of a Gilbert-cell type circuit depends upon a gain of input transistors 71 and 72.

In a conventional image rejection mixer circuit, an image rejection ratio (IRR) would be degraded if two IF signals (inphase component, and quadrature component) have an amplitude error between two components or a phase error from 90° between two components, and the IRR is expressed as follows (described in RF Microelectronics, Rehzad Razavi, Prentice Hall PTR, page 143).

$$IRR \approx \{(\Delta A_{IF}/A_{IF})^2 + (\Delta \theta_{IF})^2\}/4 \quad (1)$$

One of the causes of an IF signal error is an error or a dispersion of mixer circuits. For instance, if two mixer circuits have an error of 2% in amplitude with each other, IRR would be degraded by approximate 40 dB.

FIG. 8 is a prior quadrature mixer circuit which reduces affection by an amplitude error of a mixer circuit (International Conference ISSCC93-TP9.4). The circuit of FIG. 8 has two Gilbert-cell mixers of FIG. 7, and the sources of the RF signal input transistors 81, 82, 83 and 84 are coupled together with each other. The circuit shown in FIG. 8 receives a pair of local signals LO-I and LO-Q having quadrature relation, and an RF signal in balance form or differential form, and provides a pair of IF signals IF-I and IF-Q having quadrature relation, where -I means inphase component, and -Q means quadrature component.

However, the circuit of FIG. 8 has the disadvantage that amplitude error exists between IF-I and IF-Q, because RF signal input transistors have an error in gain between 81 and 82, and between 83 and 84. As a differential pair for mixing inphase component LO-I of a local signal with an RF signal is supplied an RF signal through the transistor 81, while a differential pair for mixing a quadrature component LO-Q of a local signal with an RF signal is supplied an RF signal through the transistor 82, the difference of the gain of the transistors 81 and 82 causes an error of amplitude of an output IF signal between the inphase component and the quadrature component.

FIG. 9 is the improvement of FIG. 8 for removing amplitude error between IF-I and IF-Q, by feeding an RF input signal to both differential pairs for inphase component and quadrature component by using a common differential pair (91 and 92).

However, the circuit of FIG. 9 has a disadvantage in that phase error of output IF signals is larger than phase error of local signals (LO-I, LO-Q), when a pair of local signals (LO-I, LO-Q) have phase error ($\Delta\theta_{LO}$:radian) from 90°. For instance, when a FIG. 9 circuit is constituted by using a CMOS having gate length 0.2 μm, the following result is obtained in the circuit simulation using HSPICE.

$$\Delta\theta_{IF} \approx 1.4 \Delta\theta_{LO}$$

Thus, the FIG. 9 circuit is worse by approximately 3 dB in IF signal phase error as compared with the FIG. 8 circuit in which ($\Delta\theta_{IF} = \Delta\theta_{LO}$).

The reason why the phase error of an output signal is large in FIG. 9 is that a bias potential of a differential pair 2 for mixing a local signal with an RF signal cannot be independent from a bias potential of a transistor of a differential amplifier for an input RF signal. A bias potential of a differential pair affects much to phase of an output IF signal. In FIG. 9, transistors 91 and 92 of a differential amplifier are biased through a resistor connected to a gate of each transistor, and a bias transistor 93, which is used in the Gilbert-cell mixer of FIG. 7. The transistors of differential pairs 2 are biased through a resistor connected to a gate of each transistor, and a bias current in the differential amplifier 91, 92. In other words, bias current in the differential amplifier 91, 92 affects the bias current in the differential pairs 2. Therefore, it is impossible to bias the differential pairs 2 to the optimum bias potential to obtain the minimum phase error of an output IF signal.

SUMMARY OF THE INVENTION

It is an object of the present invention, therefore, to provide a new and improved mixer circuit by overcoming the disadvantages and limitations of a prior mixer circuit.

It is also an object of the present invention to provide a quadrature mixer circuit which provides excellent image rejection by decreasing an amplitude error and a phase error of an output IF signal in differential form.

It is also an object of the present invention to provide a complex mixer circuit which provides excellent image rejection by decreasing an amplitude error and a phase error of an output IF signal in differential form.

The present mixer circuit receives an RF input signal, and a first local signal LO-I in differential form, and a second local signal LO-Q in differential form. The first local signal LO-I is an inphase component of the local signal, and the second local signal LO-Q is a quadrature component of the local signal. The quadrature component has a phase relation with the inphase component such that the phase of the former is shifted by 90° from that of the quadrature component.

The present mixer circuit provides an output IF signal having an inphase component IF-I and a quadrature component IF-Q in differential form. The frequency of the output IF signal is generally the difference between the frequency of the input RF signal and the frequency of the local signal.

According to the present invention, a plurality of differential pairs each having a pair of transistors are provided for mixing each signal (a, b) of each component (LO-I, LO-Q) of a local signal (LO) with each signal (a, b) of an RF signal (RF).

An input RF signal is amplified by using a differential amplifier which has a pair of transistors.

Each-differential pair receives a local signal (LO-I, LO-Q) each having signals (a, b) at a gate of each of the transistors, and an output of said differential amplifier at a source of the transistors. An output of a transistor of each differential pair is combined with an output of a transistor of another differential pair, and provides a component of an output IF signal.

A first feature of the present invention is that a source of each of the differential pairs and a differential amplifier is coupled with a power source potential through an impedance circuit which has high impedance for operational frequency of the circuit and short-circuited for D.C. current. This allows to provide a bias potential to a gate of a transistor of a differential pair independently from a bias potential of a gate of a transistor of a differential amplifier. An independent bias potential allows a differential pair and a differential amplifier to have optimized bias potential so that a phase error of an output IF signal is a minimum, in other words, a quadrature component of an output IF signal has the exact phase relation of 90° with an inphase component of an output IF signal.

Another feature of the present invention is that a differential pair of an inphase component and a differential pair of a quadrature component are supplied an RF input signal directly by each transistor of a differential amplifier. This allows to decrease a phase error of an output IF signal than a phase error of a local signal. Assuming that a local signal LO has some phase error, then, a transistor of a differential pair driven by an inphase component of a local signal would simultaneously open or close with a transistor of a differential pair driven by a quadrature component of a local signal. Then, an RF current signal supplied by a differential amplifier is shared between the differential pairs. Thus, the amplitude of an IF output is decreased, and then, causes a phase error of an output IF signal to be decreased.

The impedance circuit may be a tank circuit having a parallel circuit of a capacitor and an inductor, resonating with operational frequency, an input RF frequency, or a local frequency. Alternatively, said impedance circuit may be a mere inductor, having large impedance for an operational frequency, and short-circuited for D.C. current.

BRIEF DESCRIPTION OF THE DRAWINGS

The foregoing and other objects, feature, and attendant advantages of the present invention will be understood by means of the following description and drawings wherein.

DESCRIPTION OF THE PREFERRED EMBODIMENTS

Figure 1:
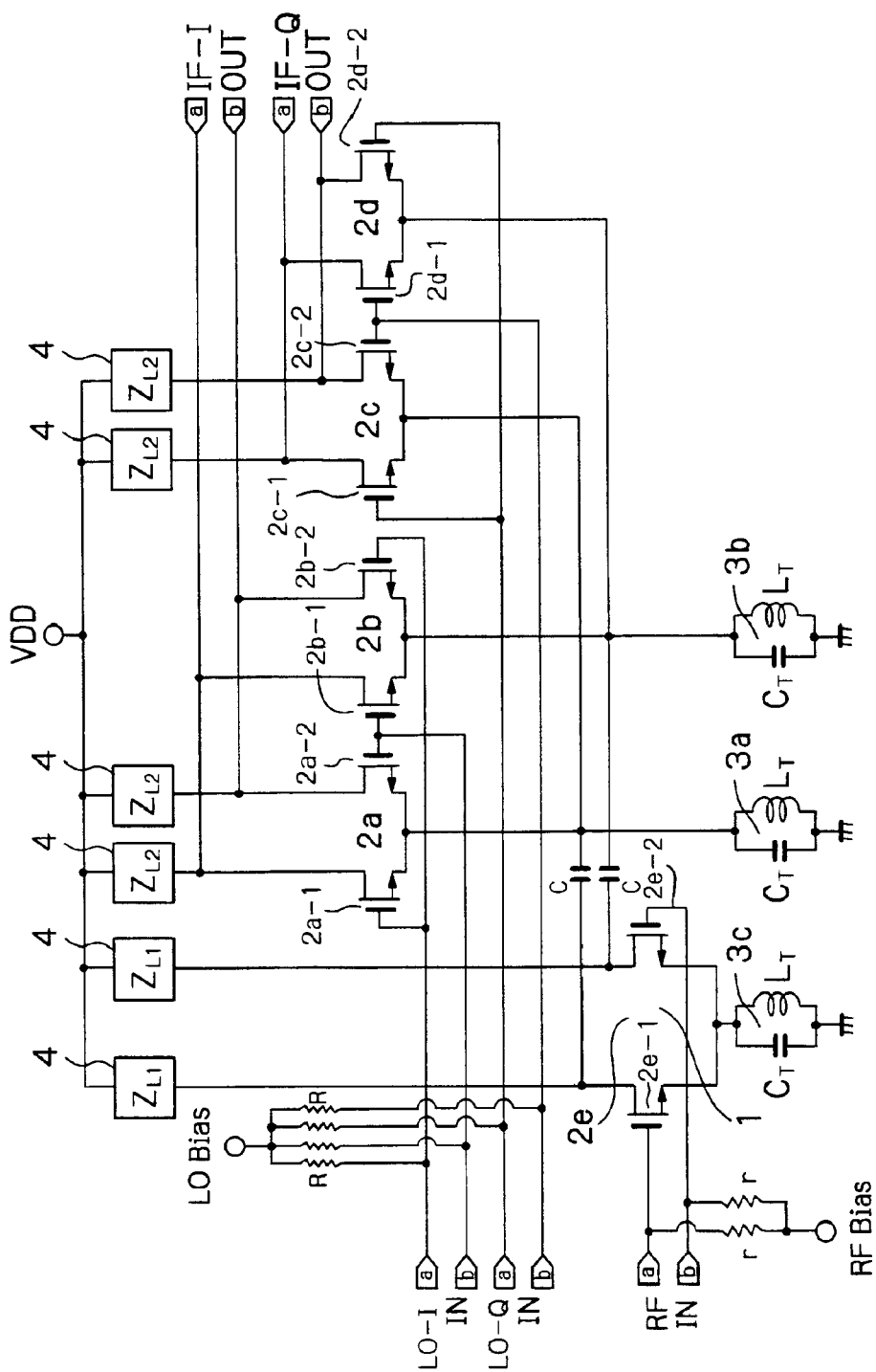
FIG. 1 shows a quadrature mixer circuit of one embodiment according to the present invention.

FIG. 1 is a quadrature mixer circuit of the first embodiment according to the present invention. In FIG. 1, the numeral 1 is a differential amplifier, 2a, 2b, 2c, 2d and 2e are differential transistor pairs, 3a, 3b and 3c are impedance circuits, and 4 is a load of a transistor.

In the figure, an RF receive signal in balanced form or differential form is applied to gates of an RF input differential pair 2e, whose sources are coupled with a second power source or grounded through a third impedance circuit 3c, and whose drains are coupled with a first power potential VDD through loads ZL1.

A signal in balanced form is also called a signal in differential form. On the other hand, a signal in unbalanced form is called a single-ended signal.

A first local signal LO-I is in balanced form having terminals (a) and (b). Similarly, a second local signal LO-Q is in balanced form having quadrature relation with the first local signal LO-I, having terminals (a) and (b). A first terminal (a) of the first local signal LO-I is connected to a gate of a first transistor 2a-1 of a first differential pair 2a, and a gate of a second transistor 2b-2 of a second differential pair 2b. A second terminal (b) of a first local signal LO-I is connected to a gate of a second transistor 2a-2 of a first differential pair 2a and a gate of a first transistor 2b-1 of a second differential pair 2b.

Similarly, a first terminal (a) of a second local signal LO-Q is connected to a gate of a first transistor 2c-1 of a third differential pair 2c, and a gate of a second transistor 2d-2 of a fourth differential pair 2d. Similarly, a second terminal (b) of a second local signal LO-Q is connected to a gate of a second transistor 2c-2 of a third differential pair 2c, and a gate of a first transistor 2d-1 of a fourth differential pair.

The sources of the transistors 2a-1 and 2a-2 of the first differential pair 2a, and the sources of the transistors 2c-1 and 2c-2 of the third differential pair 2c are grounded through a first impedance circuit 3a, and are coupled with a drain of a first transistor 2e-1 of the differential amplifier 2e through a capacitor C. Similarly, the sources of the transistors 2b-1 and 2b-2 of the second differential pair 2b, and the sources of the transistors 2d-1 and 2d-2 of the fourth differential pair 2d are grounded through a second impedance circuit 3b, and are coupled with a drain of a second transistor 2e-2 of the differential amplifier 2e through another capacitor C.

A drain of the first transistor 2a-1 of the first differential pair 2a and a drain of the first transistor 2b-1 of the second differential pair 2b are coupled with the first potential VDD through a load ZL2, and are coupled with a first terminal (a) of a first intermediate frequency output IF-I in balanced form. A drain of the second transistor 2a-2 of the first differential pair 2a and a drain of the second transistor 2b-2 of the second differential pair 2b are coupled with a first potential VDD through a load ZL2, and are coupled with a second terminal (b) of the first intermediate frequency output IF-I.

A drain of the first transistor 2c-1 of the third differential pair 2c and a drain of the first transistor 2d-1 of the fourth differential pair 2d are coupled with the first potential VDD through a load ZL2, and are coupled with a first terminal (a) of a second intermediate frequency output IF-Q in balanced form. A drain of the second transistor 2c-2 of the third differential pair 2c and a drain of the second transistor 2d-2 of the fourth differential pair 2d are coupled with a first potential VDD through a load ZL2, and are coupled with a second terminal (b) of the second intermediate frequency output IF-Q. The second output signal IF-Q is in quadrature relation with the first output signal IF-I.

Each of the impedance circuits 3a, 3b and 3c has a capacitor CT and an inductor LT which resonate at operational frequency, input frequency RF, and local frequency LO. Alternatively, said impedance circuit may be an inductor which has a large impedance at the operational frequency, and is essentially short-circuited for D.C. current.

It should be noted in FIG. 1 that it has a pair of complemental type mixer circuits for inphase signal (I), and quadrature signal (Q), respectively. As the differential amplifier 2e which accepts an RF signal, and a pair of impedance circuits 3a and 3b, are common to a first mixer for inphase signal (I) and a second mixer for quadrature signal (Q). That structure allows a phase error between IF-I and IF-Q to decrease than that between local signals LO-I and LO-Q.

As each of the impedance circuits has a large impedance at the operational frequency, the impedance circuit is considered to be open in A.C. operation at the operational frequency, while it is short-circuited in D.C. operation. Therefore, the operation of FIG. 1 is equivalent in A.C. operation to that of FIG. 9. As an RF input transistor is common to inphase (I) component and quadrature component (Q) of mixers, the phase error between IF-I and IF-Q is much decreased. Assuming that there exists a phase error on a local signal between LO-I and LO-Q, transistors in differential pairs for inphase component and quadrature component would open simultaneously. This would cause the decrease of amplitude of an input RF signal of an output of the differential amplifier 2e than the case where there is no phase error in a local signal, since transistors of the differential pairs for both inphase component and quadrature component are supplied an input RF signal by a common transistor 2e-1 or 2e-2. The decrease of amplitude of an input RF signal to differential pairs would cause to compensate phase error of local signal. Thus, the phase error of output IF signal is smaller than that of input local signal.

Further, it should be noted in FIG. 1 that a capacitor C is inserted between an output of the differential amplifier 2e and the sources of the differential pairs 2a through 2d, so that the differential amplifier 2e is separated from the differential pairs 2a through 2d in D.C. operation. Therefore, the present invention has the advantage that an operational bias potential of the differential pairs 2a through 2d is independent from an operational bias potential of the differential amplifier 2e. The operational bias potential of the differential pairs 2a through 2d is supplied to a gate of a transistor through a resistor R coupled with the first source potential VDD, and the operational bias potential of the differential amplifier 2e is supplied to a gate of a transistor through another resistor r coupled with the first source potential VDD. As the phase error between output signals IF-I and IF-Q depends upon an operational bias potential, it is preferable to design an operational bias potential of the differential pairs 2a through 2d so that the phase error of an output signal between IF-I and IF-Q is smaller than the phase error of a local signal between LO-I and LO-Q.

Figure 2:
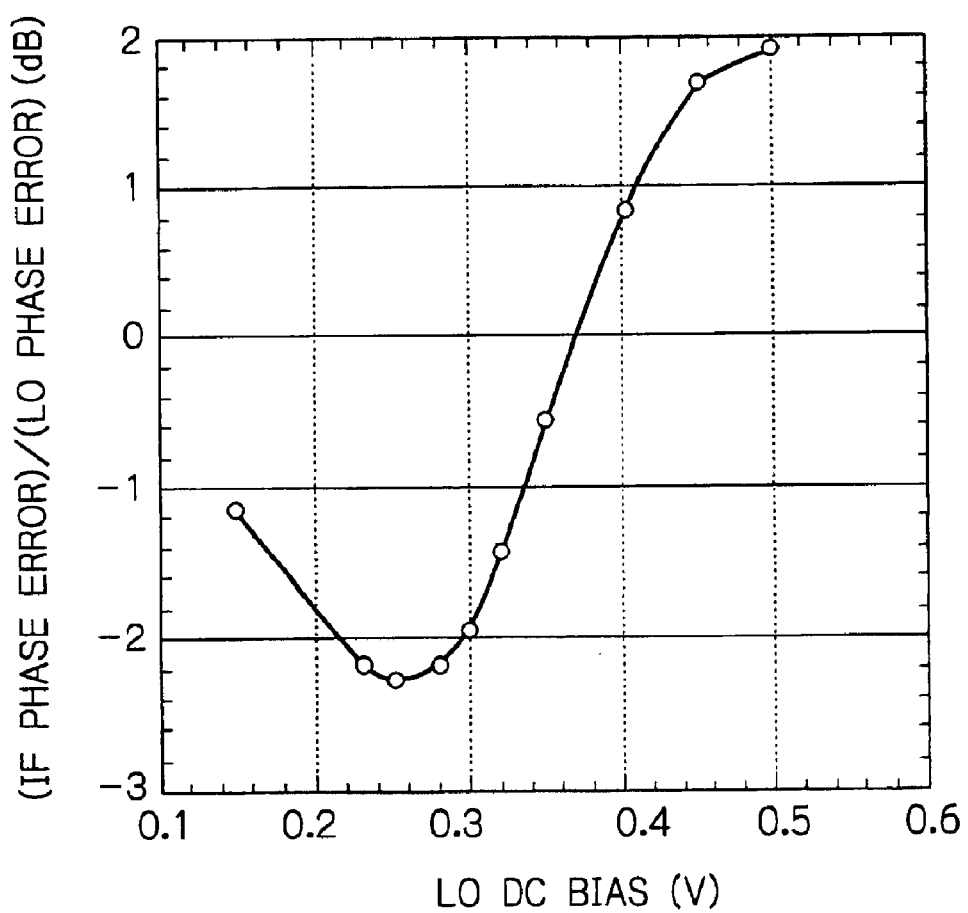
FIG. 2 shows relations between D.C. bias potential of a differential pair and a phase error, simulated by using a circuit simulator HSPICE.

FIG. 2 shows the relation between D.C. bias potential of a transistor which receives a local signal LO (horizontal axis) and the ratio of the phase error of an output IF signal to the phase error of a local signal LO. FIG. 2 is the simulation result by using the circuit simulator HSPICE, and assumes that the circuit of FIG. 1 is constituted by using a CMOS with gate length 0.2 $\mu$m. It should be noted in FIG. 2 that when a D.C. bias potential between a gate- and a source of a transistor of the differential pairs 2a through 2d is around a threshold value (approximate 0.3 V) of a transistor, the phase error of the output IF signals is;

$\Delta\theta_{IF} < 0.8 \Delta\theta_{LO}$,

Thus, it should be appreciated that the phase error between local signals (LO-I and LO-Q) is improved by approximately 2 dB. On the other hand, in a prior art of FIG. 9 in which the bias potential of the differential pairs is not independent from the bias potential of the differential amplifier, the phase error of output IF signals (IF-I and IF-Q) is worse by 3 dB than the phase error of LO signals (LO-I and LO-Q). Therefore, the embodiment of FIG. 1 is improved by more than 5 dB in phase error as compared with the prior art of FIG. 9.

Figure 8:
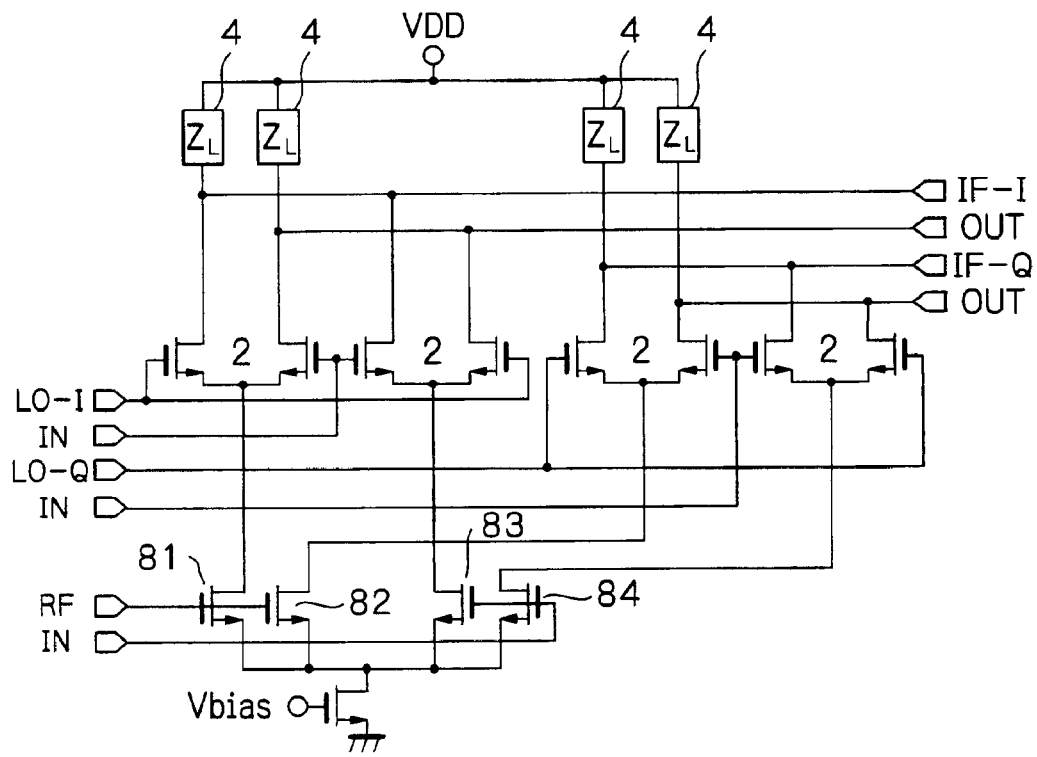
FIG. 8 is a prior quadrature mixer circuit.
Figure 9:
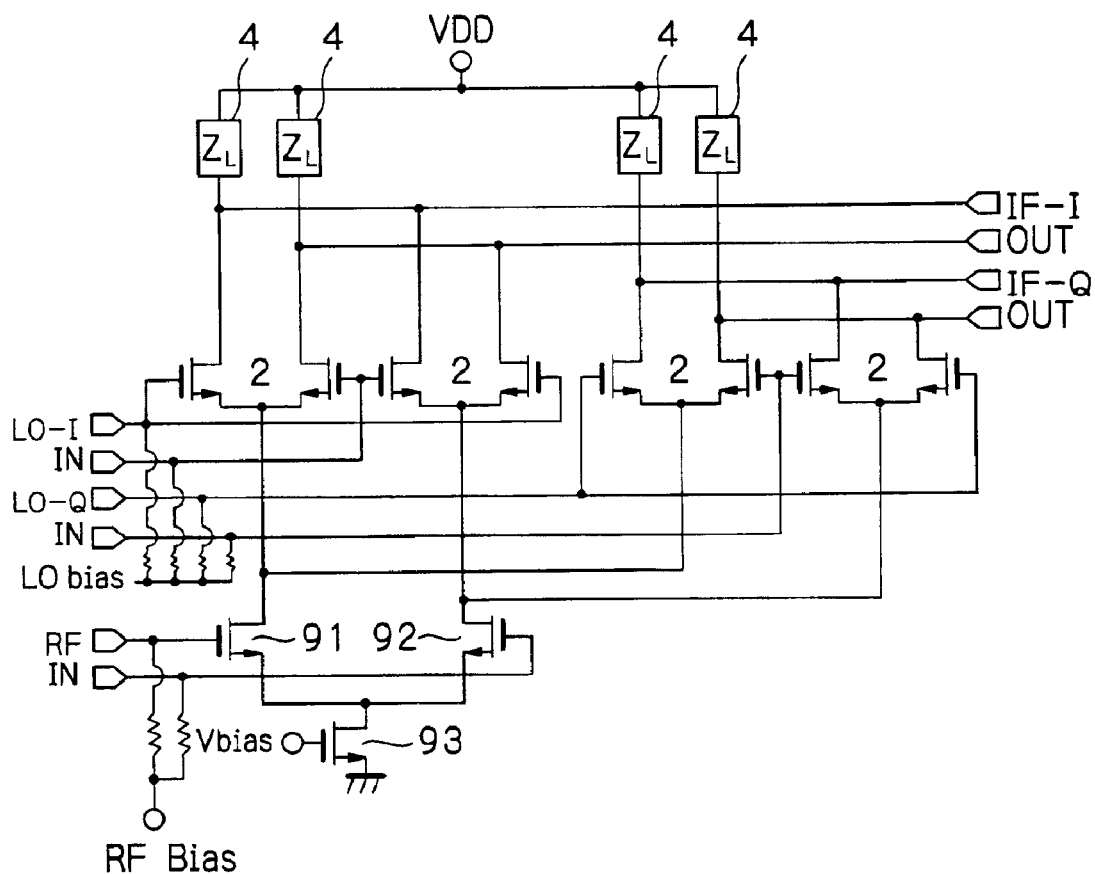
FIG. 9 is a prior quadrature mixer circuit in which each transistor of an RF differential amplifier supplies an output signal commonly both to an inphase component mixer and a quadrature component mixer.

It should be noted that a prior art of FIG. 8 and a prior art of FIG. 9 cannot have the advantage of FIG. 1. The FIG. 8 circuit supplies an input RF signal to an I-branch mixer and a Q-branch mixer through different transistors so that amplitude of an input RF signal in I-branch mixer might be different from amplitude of an input RF signal in Q-branch mixer. This causes an amplitude error of output IF signals between IF-I and IF-Q. The circuit of FIG. 9 has the disadvantage that a D.C. bias potential between a gate and a source of a transistor of the differential pairs 2a through 2d depends upon a D.C. bias potential of the differential amplifier 2e, and the former is in general higher than the latter by approximate 0.2 V.

Figure 3:
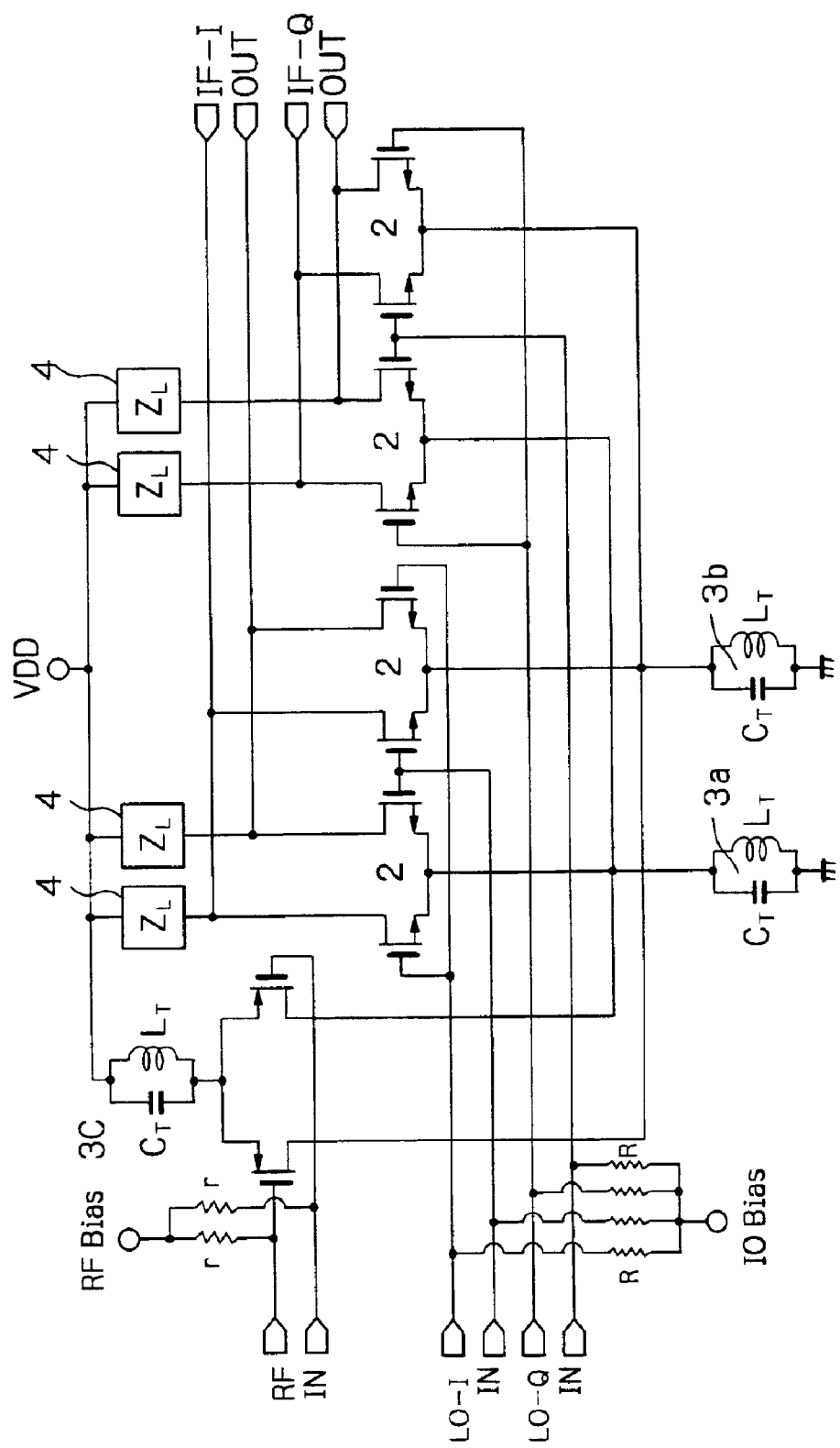
FIG. 3 shows a quadrature mixer circuit of another embodiment according to the present invention.

FIG. 3 shows a second embodiment of a quadrature mixer circuit according to the present invention. The features of FIG. 3 as compared with FIG. 1 are that an RF input differential amplifier is constituted by using a PMOS transistor, instead of an NMOS transistor, and that a drain of an RF input transistor is directly connected to sources of differential pairs which receive a local signal LO (no capacitor is used). In this embodiment, an operational bias potential of an input RF differential amplifier can be independent from an operational bias potential of differential pairs which receive a local signal LO. Therefore, the FIG. 3 embodiment has an effect similar to that of the FIG. 1 embodiment. Further, no load resistor ZL1 is used in FIG. 3 embodiment.

Instead, an impedance circuit 3c functions as a load. This improves the phase error of an output IF signal (IF-I and IF-Q) more than that of the FIG. 1 embodiment.

Figure 4:
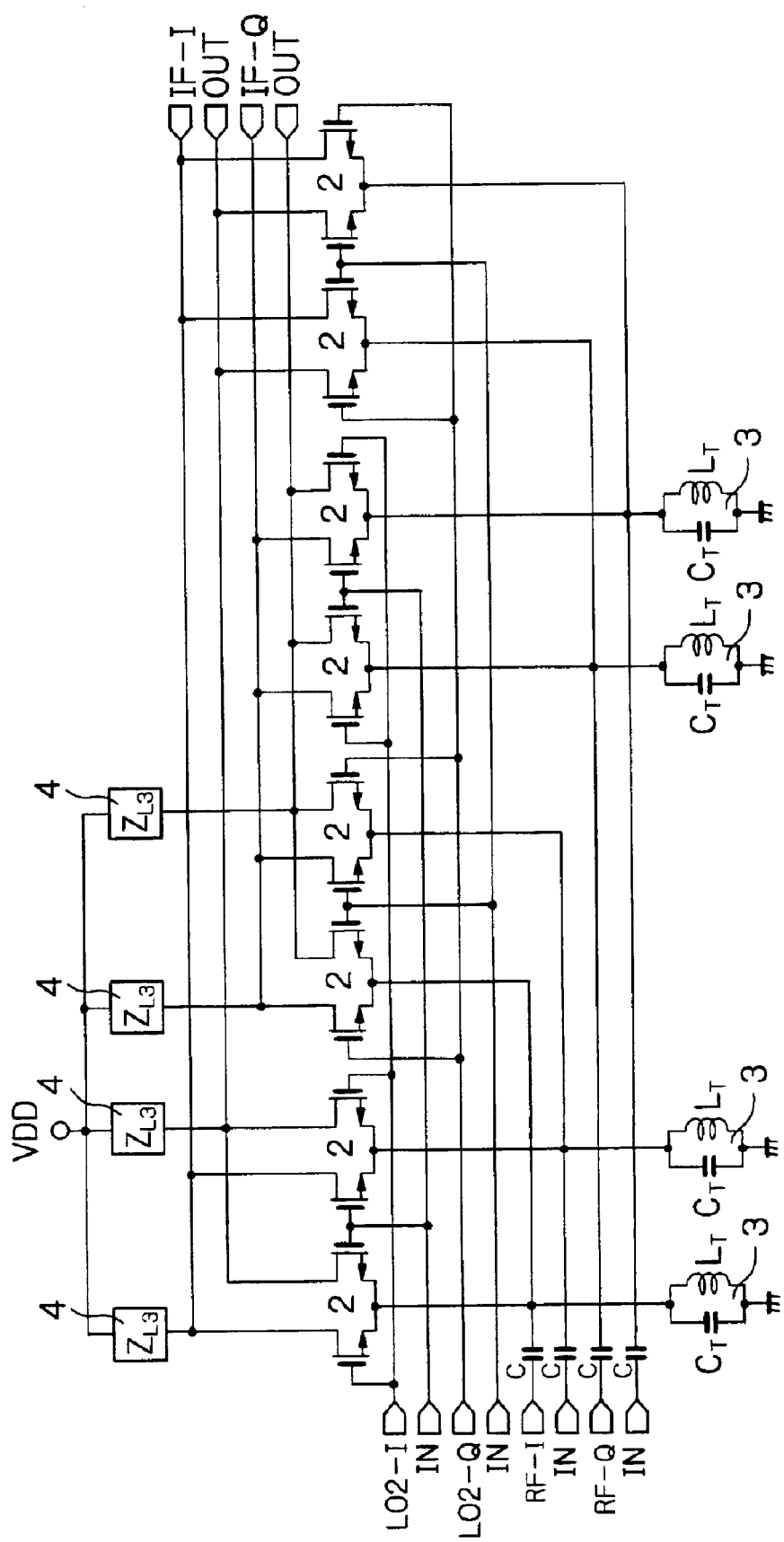
FIG. 4 shows a complex mixer circuit of one embodiment according to the present invention.

FIG. 4 shows a third embodiment of the present invention. FIG. 4 is a complex mixer circuit having a real mixer and an imaginary mixer. A complex mixer circuit has an advantage that a phase error and an amplitude error of an output signal are small.

The FIG. 4 embodiment comprises a pair of quadrature mixers of FIG. 1, and has a feature that a local signal LO and a load impedance are common to both a read mixer and an imaginary mixer. Bias resistors R and r exist in the FIG. 4 embodiment, but are not shown for the sake of simplicity of the figure.

Each of the quadrature mixers in FIG. 4 carries out the multiplication of a pair of RF signals having quadrature relations with each other in balanced form, and a pair of local signals LO having quadrature relations with each other in balanced form. As a load impedance is common, first products are added, and the other products are subtracted, to provide an output IF signal.

A complex mixer circuit has the advantage in that an error component in an output IF signal is decreased, since an error component of an output IF signal is only a product component of an error component of an input RF signal and an error component of a local signal LO, as described in "CMOS Wireless Transceiver Design, Jan Crols and Michiel Steyaert, Kluwer Academic Publishers, p179".

The embodiment of FIG. 4 has an effect similar to that of the FIG. 1 embodiment, so that a phase error in local signals LO is decreased. Thus, an error in an output IF signal is considerably decreased.

It is assumed in FIG. 4 that an input RF signal is in balanced form, therefore, a differential amplifier for converting an input signal in unbalanced form to balanced form is omitted. It is a matter of course that an input RF signal may be in single-ended form (unbalanced form), which is converted to balanced form by using a differential amplifier 2e, as shown in FIG. 1.

Figure 5:
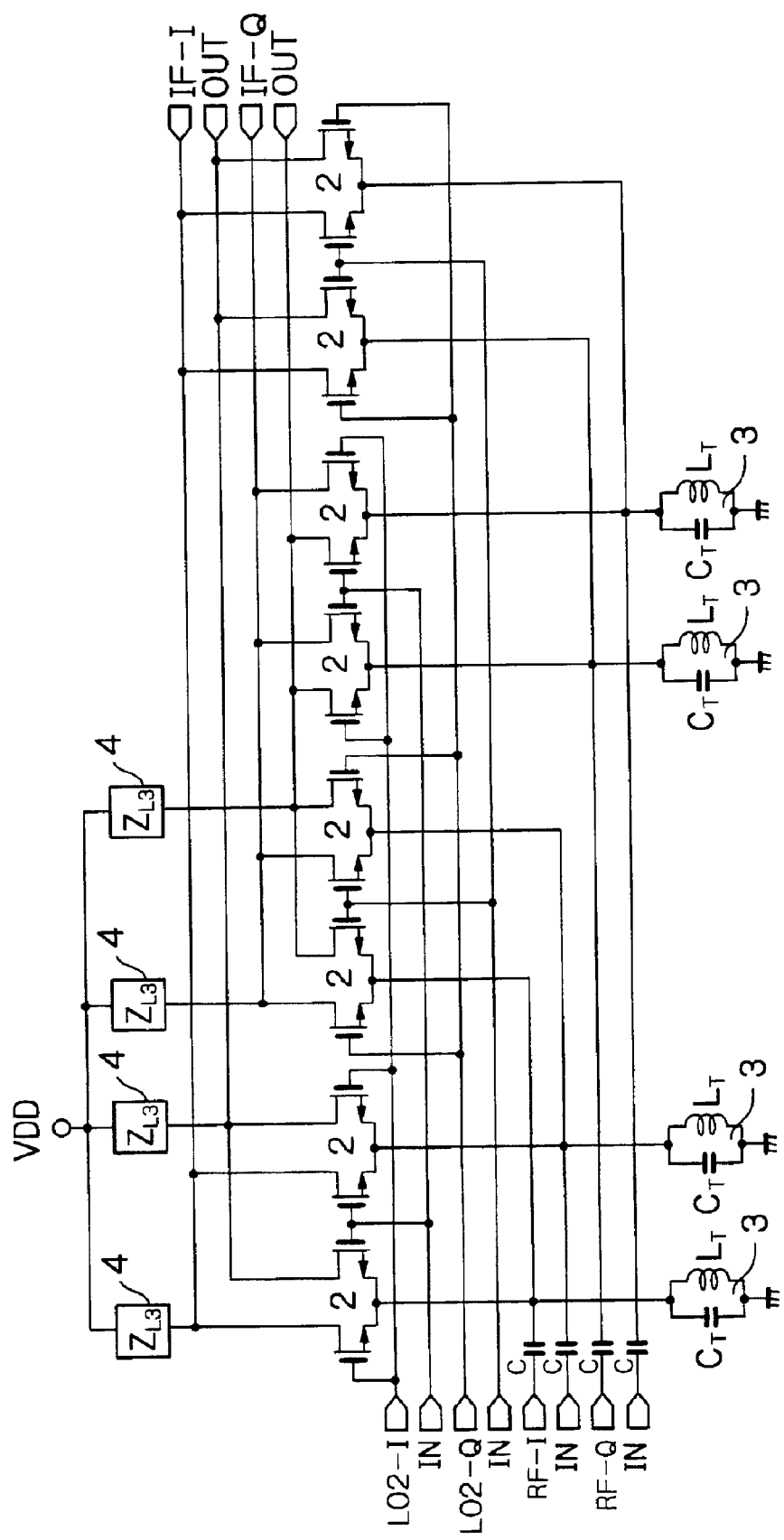
FIG. 5 shows a complex mixer circuit of another embodiment according to the present invention.
Figure 6:
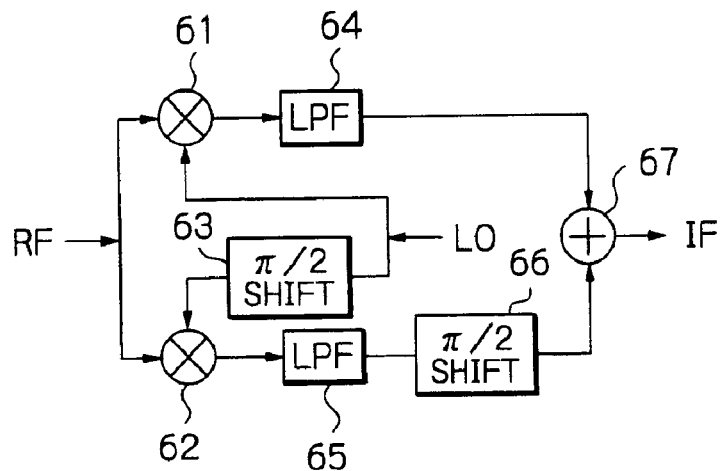
FIG. 6 is a prior image rejection mixer circuit.
Figure 7:
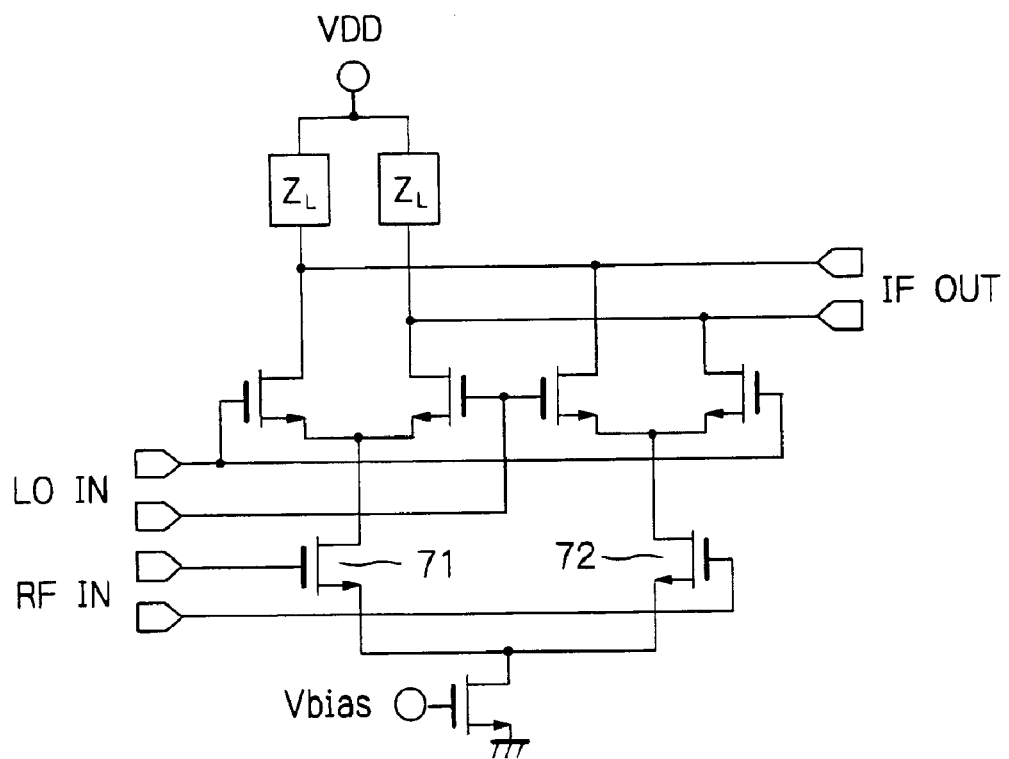
FIG. 7 is a prior Gilbert-cell mixer circuit.

FIG. 5 is a modification of FIG. 4. The feature of the FIG. 5 modification is that IF-I is the sum of the product of LO2-I and RF-I and the product of LO2-Q and RF-Q, and IF-Q is the difference between the product of LO2-Q and RF-I and the product of LO2-Q and RF-Q, while in the FIG. 4 embodiment IF-I is the difference between the product of LO2-I and RF-I and the product of LO2-Q and RF-Q, and IF-Q is the sum of the product of LO2-Q and RF-I and the product of LO2-Q and RF-Q.

A differential pair for accepting a local signal LO in FIGS. 1, 4 and 5 are constituted by using an NMOS transistor. As a modification, a differential pair may be constituted by using a PMOS transistor. In that case, a source potential and a ground potential are exchanged with each other.

In the above embodiments and modifications, an impedance circuit, or a tank circuit, is used as a constant current source. As a variation, a constant current source may be an inductor or an RF choke coil having high impedance in operational frequency and being essentially short-circuited to D.C. current. Alternatively, an impedance circuit may be substituted with a conventional current source having a transistor with a fixed gate potential.

The present mixer circuit can provide a radio receiver with a high degree image rejection by decreasing a phase error in an output IF signal than that in an input LO signal.

When an input RF signal is supplied in single-ended form or unbalanced form, it must be converted into balanced form. Now, the conversion of a signal in unbalanced form into balanced form is described.

In converting a signal in unbalanced form into balanced form, it is preferable that conversion loss is as small as possible, and a pair of converted signals are well balanced with small amplitude error.

Figure 10:
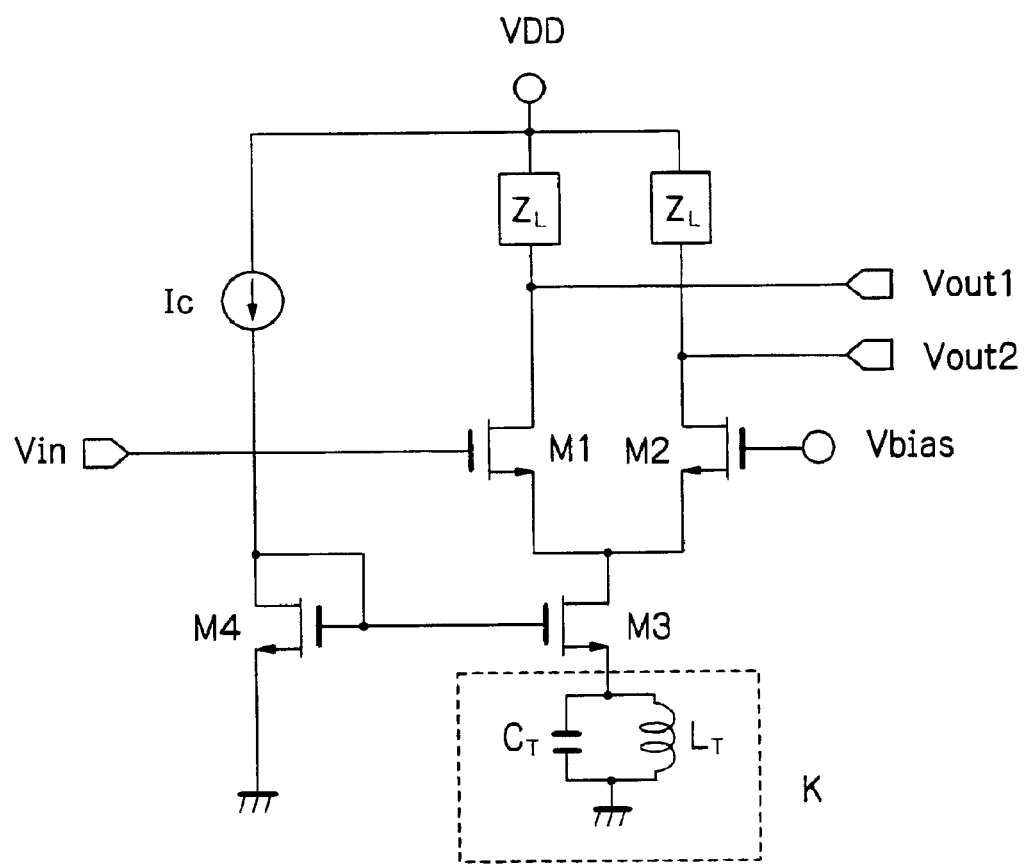
FIG. 10 is a circuit diagram of a converter from a single-ended signal into balanced signal according to the present invention.

FIG. 10 is a differential amplifier for converting an input signal Vin in unbalanced form into a pair of output signals Vout1 and Vout2 in balanced form. In the figure, the transistors M3 and M4 constitute a current mirror circuit so that the transistor M3 functions as a constant current source. A tank circuit K having a parallel circuit of a capacitor CT and an inductor LT is coupled between a source of the transistor M3 and the ground, so that negative feed back is obtained with the impedance of the tank circuit K.

An input signal Vin in single-ended form is applied to a gate of a transistor M1 which constitute a differential amplifier with a transistor M2, and a gate of the other transistor M2 receives a fixed bias potential Vbias. A pair of outputs Vout1 and Vout2 in balanced form are obtained at outputs of the transistors M1 and M2.

Figure 11:
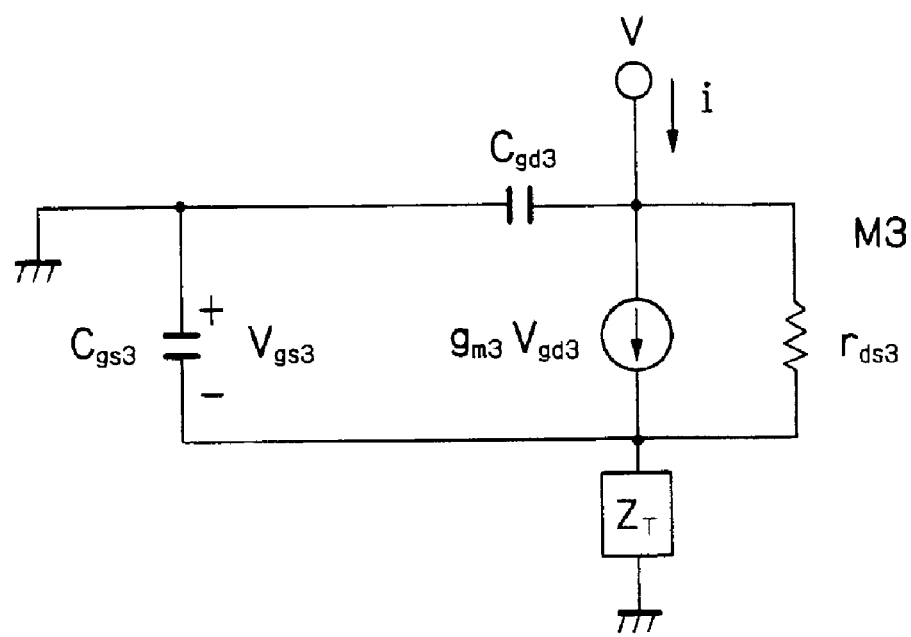
FIG. 11 shows an equivalent circuit of a constant current source in FIG. 10.

Assuming that a tank circuit K has impedance ZT, an equivalent circuit of a constant current source having the transistor M3 and the tank circuit K is shown in FIG. 11 for a small signal which satisfies a linear approximation around the operating point of the circuit, where Vgs3 is a voltage between a gate and a source of the transistor M3, Cgs3 is a capacitance between the gate and the source of the transistor M3, Cgd3 is a capacitance between the gate and the drain of the transistor M3, and rds3 is resistance between the drain and the source. It is assumed that $Zt=+\infty$, and $|gm3*rds3|>>1$ are approximately satisfied for a signal close to the resonance frequency of the tank circuit K. In that case, it is simply proved that the output impedance Z0 is $Z0 \equiv v/i \approx 1/j\omega Cgd3$. In other words, the current source may be replaced approximately by the capacitance Cgd3 between the gate and the drain of the transistor M3.

Figure 12:
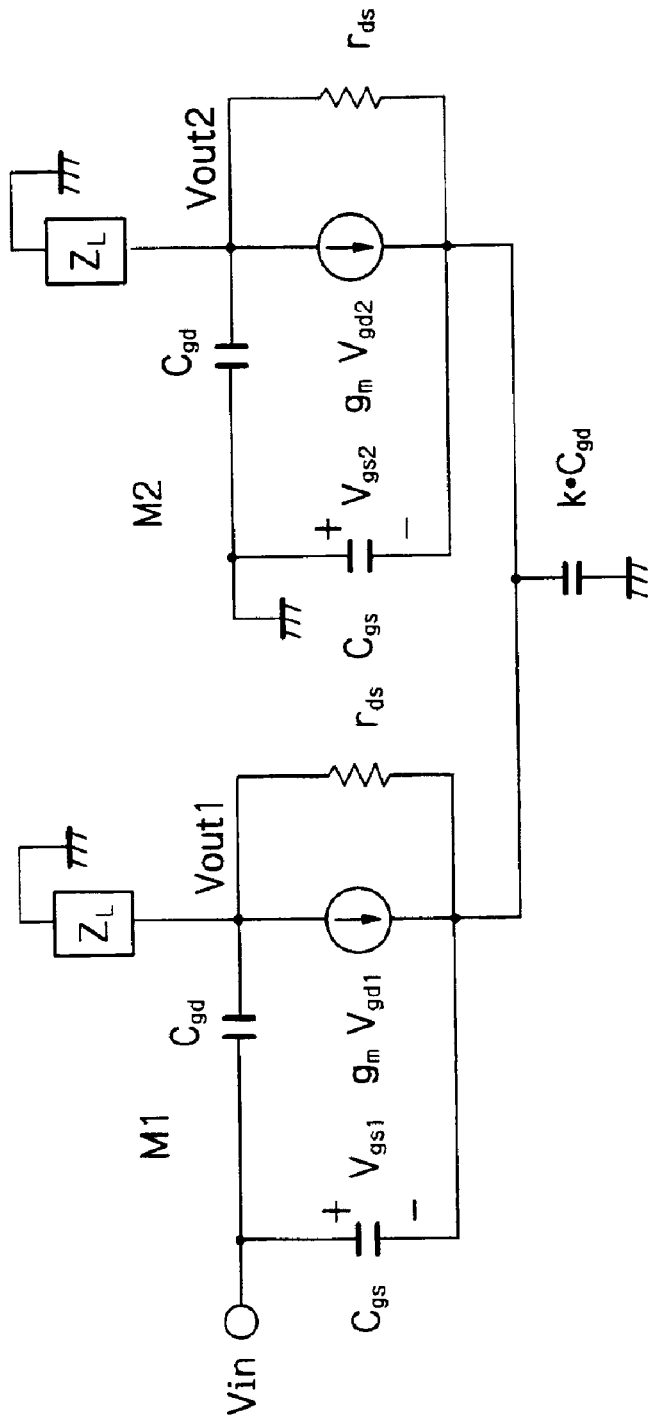
FIG. 12 shows an equivalent circuit of an amplifier in FIG. 10.

A model for a small signal of the unbalance/balance converter in FIG. 10 is expressed as shown in FIG. 12. It is assumed that the gate width of the transistor M1 is equal to the gate width of the transistor M2, and the gate width of the transistor M3 is k times as large as that of the transistor M1. That small signal model introduces the following simultaneous equations, where a suffix shows a parameter of a transistor relating to a FIG. (1 or 2) of transistors M1 and M2, and Vgs1 is voltage between a gate and a source of the transistor M1. The symbol gm is transconductance of the transistors M1 and M2, and it is assumed gm=gm1=gm2, as the size of those transistors is the same as for each other. Similarly, a parameter (Cgd, Cgs, rds) relating to the same size is used with no suffix.

$$j\omega*Cgd(Vin-Vout1)-Vout1/ZL-gm(Vin+Vgs2)-(Vgs2+Vout1)/rds=0$$

$$j\omega*Cgs(Vin+Vgs2)+gm(Vin+Vgs2)+j\omega(Cgs+k*Cgd)Vgs2+gm*Vgs2+(Vgs2+Vout1)/rds+(Vgs2+Vout2)/rds=0$$

$$-\omega Cgd*Vout2-Vout2/ZL-gm*Vgs2-(Vgs2+Vout2)rds=0$$

When the above three equations are added, the following equation is obtained.

$$Vout1+Vout2=j\omega Cgs(Vin+2*Vgs2)+Cgd(Vin+k*Vgs2)/(1/ZL+j\omega*Cgd)$$

where currents in the transistors M1 and M2 are the same in amplitude as each other, and opposite in phase with each other. Therefore, approximately, $Vgs2=-Vgs2=-Vin/2$ is satisfied. Therefore, the following equation is satisfied.

$$Vout1+Vout2 \approx 0.5*j\omega*Cgd*Vin*(2-k)/(1/ZL+j\omega*Cgd)$$

Therefore, it should be noted that when the gate width of the transistor M3 is twice as large as that of the transistor M1, an error of differential outputs of the transistors M1 and M2 resulting from an error of charge/discharge of capacitance between the gate and the drain of the transistors M1 and M2 is completely compensated by the charge/discharge of capacitance between the gate and the drain of the transistor M3, and the complete differential outputs (Vout1+Vout2=0) are obtained.

Figure 13:
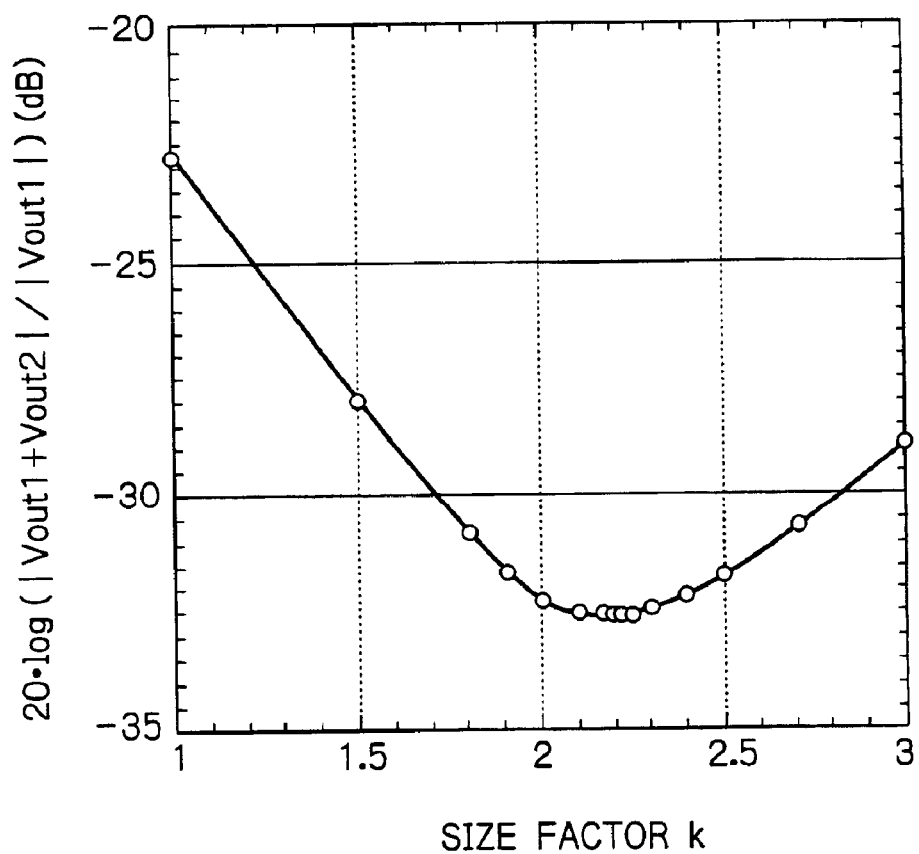
FIG. 13 shows relations between size factor k of a transistor and an error of a balanced signal, simulated by using a circuit simulator HSPECE.

FIG. 13 shows the result of the simulation using the circuit simulator HSPICE of the unbalance/balance converter of FIG. 10 at 2.45 GHz, where the horizontal axis is the size factor k of the transistor M3, and the vertical axis shows the ratio of the absolute value of the sum of two outputs (Vout1+Vout2) to the absolute value of one of the outputs (Vout1) in dB. The size factor k is the ratio of the gate width of a transistor for a current source to the gate width of a transistor for a differential pair, and the gate width of a current source transistor is k times as large as the gate width of a differential pair transistor. It should be noted in the figure that when 1.5<k<3 is satisfied, desirable differential outputs are obtained. In an actual circuit, the optimum size factor k is approximate 2.2 because Vgs2≠Vgs1. As the tank circuit K has a real part in impedance due to resistance by a wire, the Q factor of the tank circuit decreases, and therefore, even when k=2.2, the differential outputs are not complete, but have an error of 2% in amplitude.

Figure 14:
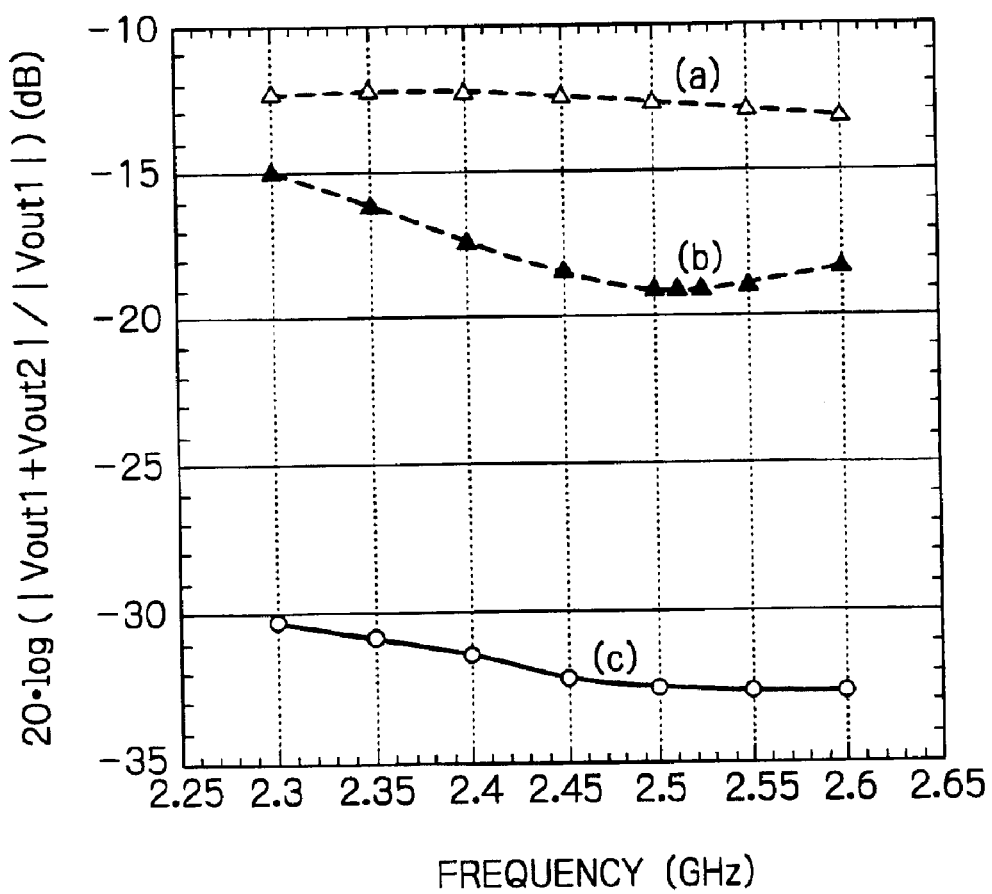
FIG. 14 shows frequency characteristics of an amplifier of FIG. 10, simulated by using a circuit simulator HSPICE.

FIG. 14 shows another simulation result using the circuit simulator HSPICE of the unbalance/balance converter of FIG. 10. The figure shows the relations between frequency (horizontal axis) and differential output characteristics (vertical axis) when the value k is fixed to 2.0. It should be noted that between 2.4 GHz and 2.5 GHz, the value of the vertical axis is between −31 dB and −33 dB (curve (c)). This means that the differential output error is improved by 14–20 dB as compared with a prior unbalance/balance conversion circuit (curve(a) or curve (b)).

Although FIG. 14 shows that the circuit is optimized for 2.4–2.5 GHz, the circuit may be optimized to any frequency by modifying the resonance frequency of the tank circuit K. Further, when a plurality of tank circuits each having different resonance frequency with each other are cascade connected, a differential amplifier for unbalance/balance converter may operate for a plurality of frequencies.

The embodiment shows the case where a gate of a current source transistor M3 is biased by a current mirror circuit. The gate may be biased by any bias means, such as a resistor ladder type source voltage divider.

Figure 15:
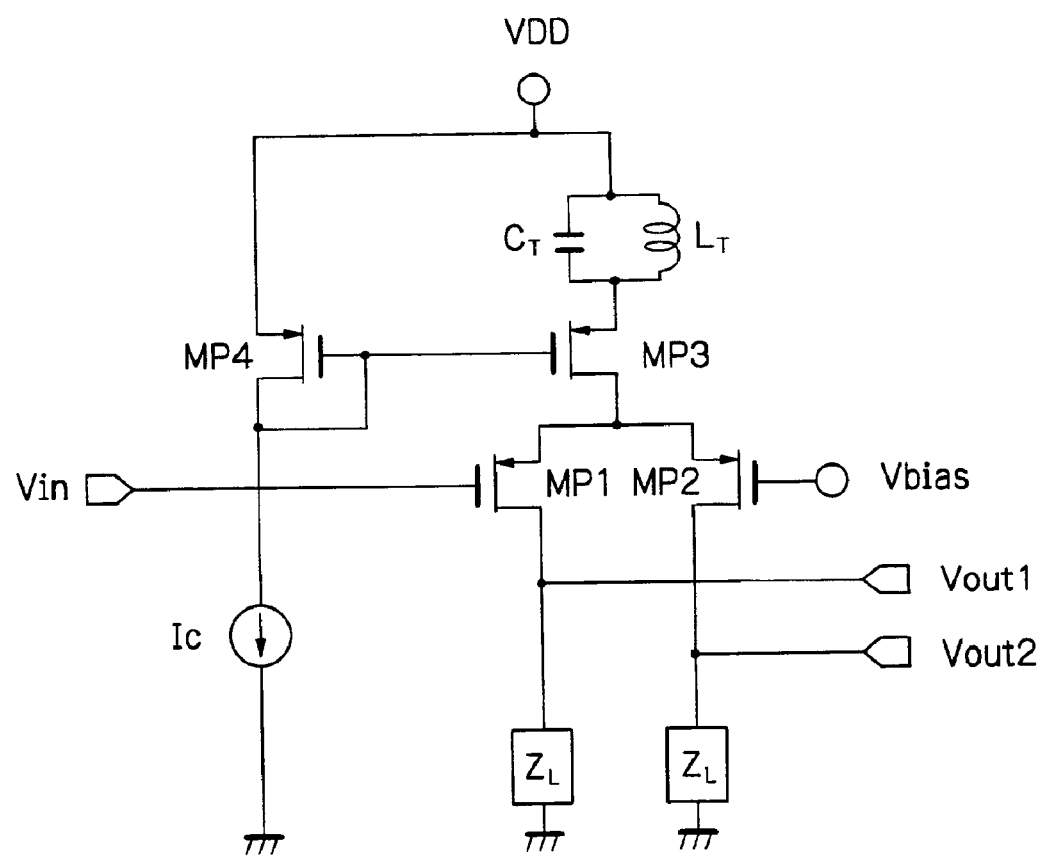
FIG. 15 is a modification of FIG. 10, FIG. 16 a quadrature mixer circuit which accepts an input RF signal in single-ended form according to the present invention.

FIG. 15 shows the modification of a differential amplifier for unbalance/balance converter. The features of FIG. 15 are that a PMOS transistor is used, instead of an NMOS transistor, and a power source potential and a ground potential are reversed. The operation of FIG. 15 is the same as that of FIG. 10.

As a modification of FIGS. 10 and 15, a tank circuit K may be replaced by an inductor.

Figure 16:
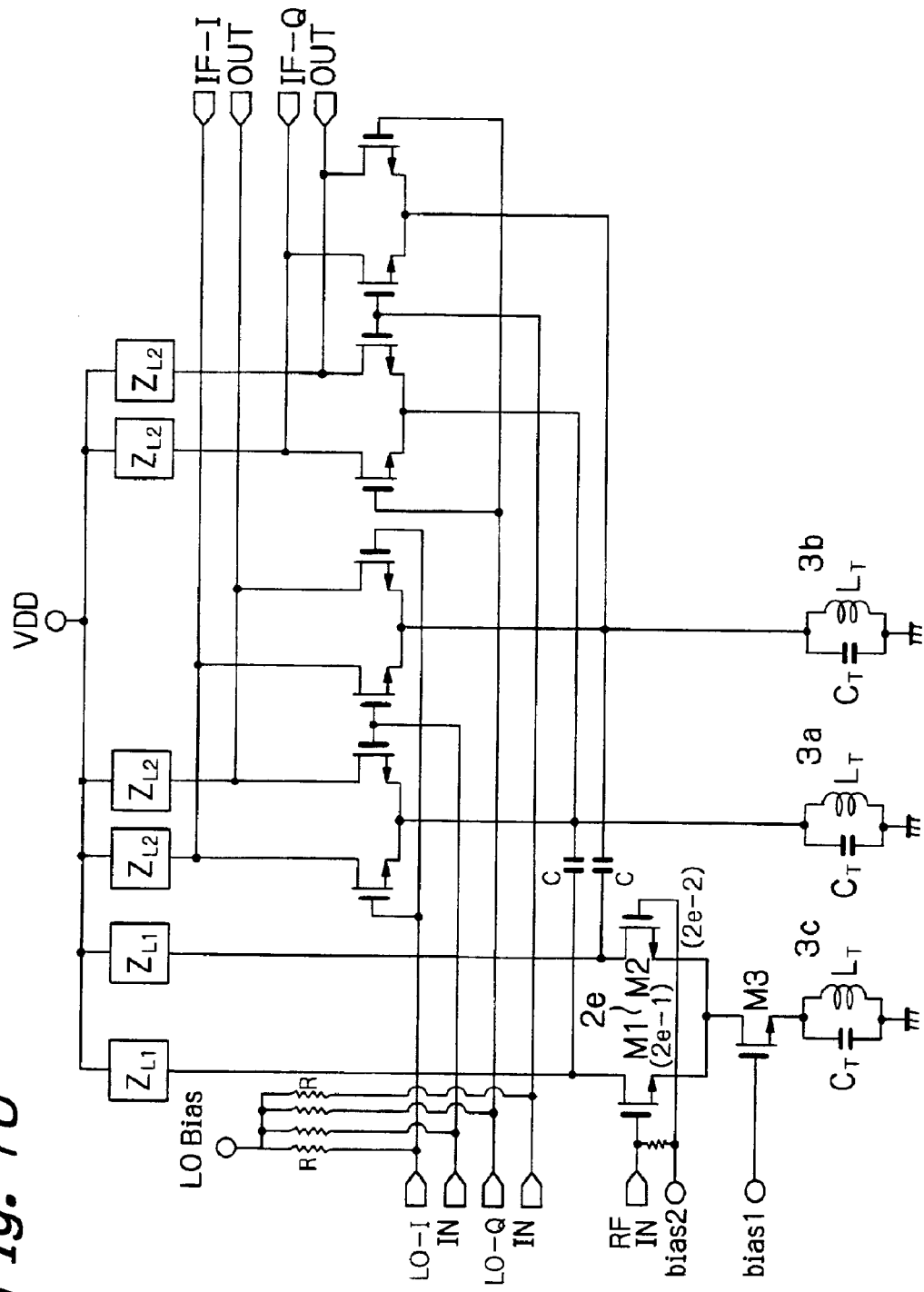

FIG. 16 shows the combination of the quadrature mixer circuit of FIG. 1 and the converter from a single-ended input signal to a differential-output of FIG. 10.

In FIG. 16, a differential amplifier 2e has a pair of transistors 2e-1 and 2e-2, which are indicated by M1 and M2. The sources of the transistors M1 and M2 are grounded through another transistor M3 and an impedance circuit or a tank circuit 3c. A signal-ended RF signal is applied to a gate of the transistor M1, while a gate of the other transistor M2 is biased by the fixed bias potential Bias2 which is further coupled with the gate of the transistor M1 through a resistor for biasing the transistor M1. The gate of the transistor M3 is biased by another bias potential Bias1. The drains of the transistors M1 and M2 are coupled with the power potential VDD through a load ZL1. The differential outputs in balanced form are obtained at the drains of the transistors M1 and M2, and those outputs correspond to outputs at the drains of the transistors 2e-1 and 2e-2 in FIG. 1. Thus, FIG. 16 operates with a single-ended RF input by converting a single-ended signal to a differential signal at the input stage of a quadrature mixer circuit.

Figure 17:
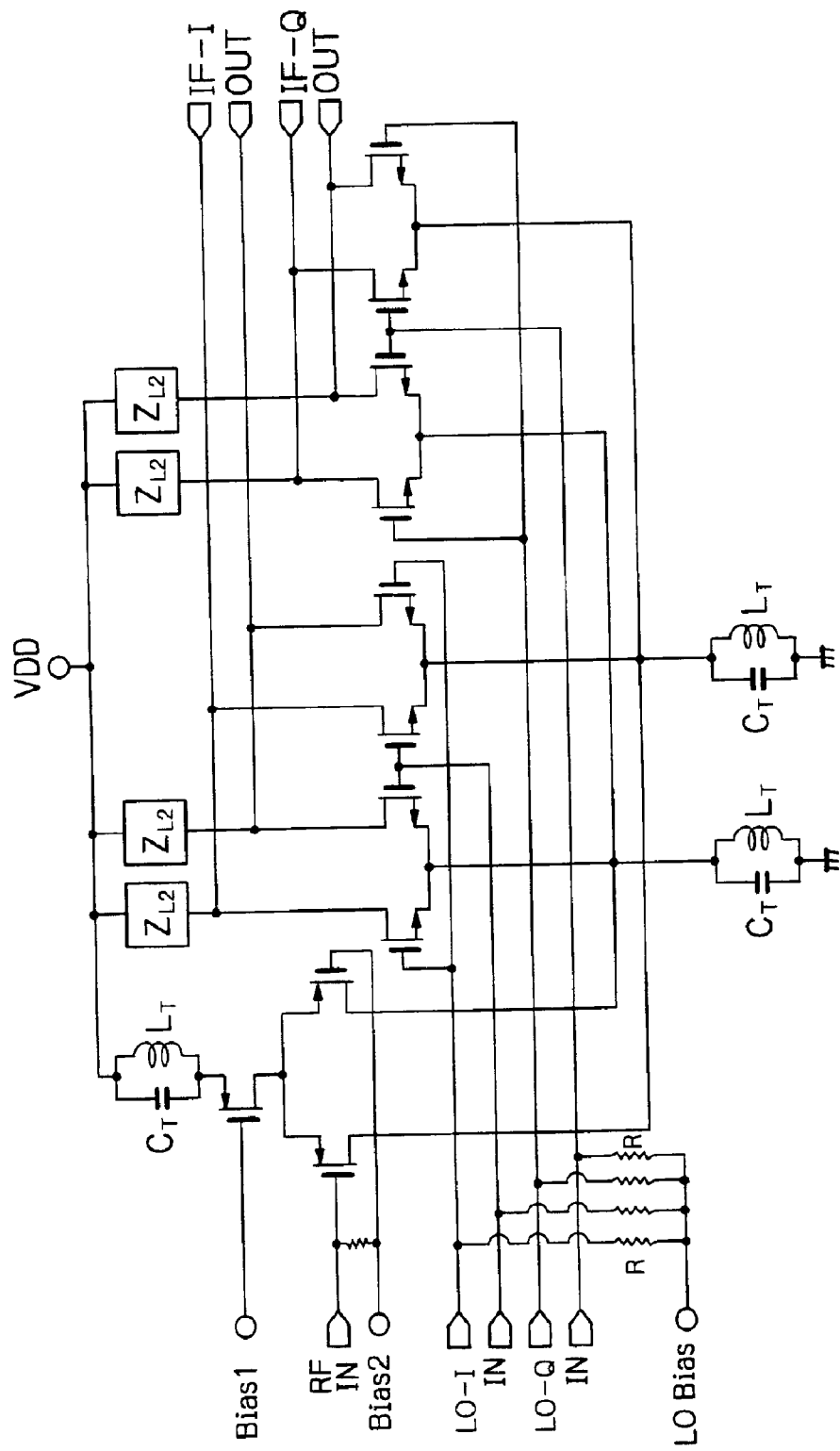
FIG. 17 is a modification of FIG. 16.

Similarly, FIG. 17 shows the combination of FIG. 3 and FIG. 15, where a PMOS transistor is used.

From the foregoing, it will now be apparent that a new and improved mixer circuit has been found. It should be understood of course that the embodiments disclosed are merely illustrative and are not intended to limit the scope of the invention. Reference should be made, therefore, for the appended claims to indicate the scope of the invention.

What is claimed is:

1. A quadrature mixer circuit which receives an RF input signal (RF), a first local signal (LO-I) in differential form and a second local signal (LO-Q) having the same frequency and quadrature relations with said first local signal in differential form, and provides first and second output intermediate signals (IF-I, IF-Q) whose frequency is a difference between frequency of said RF input signal and a frequency of said local signal, comprising;

a differential amplifier (2e) having a pair of transistors (2e-1, 2e-2) receiving said input RF signal at a gate of each of the transistors and providing differential outputs at drains of each of the transistors, each drain being coupled with a first source potential through a respective load (ZL1, ZL1), and a source of each of the transistors (2e-1, 2e-2) being coupled together and coupled with a second source potential, a first differential pair (2a) and a second differential pair (2b) receiving said first local signal on a gate of each transistor of each differential pair, a drain of first transistors (2a-1, 2b-1) of each differential pair (2a, 2b) being coupled with said first source potential (VDD) through a first load (ZL2), a drain of second transistors (2a-2, 2b-2) of each differential pair (2a, 2b) being coupled with said first source potential (VDD) through a second load (ZL2), those first and second loads providing a first output IF signal (IF-I) in differential form, a third transistor pair (2c) and a fourth differential pair (2d) receiving said second local signal on a gate of each transistor of each differential pair, a drain of first transistors (2c-1, 2d-1) of each differential pair (2c, 2d) being coupled with said first source potential (VDD) through a third load (ZL), and a drain of second transistors (2c-2, 2d-2) of each differential pair being coupled with said first source potential (VDD) through a fourth load (ZL2), those third and fourth loads providing a second output IF signal (IF-Q) in differential form, said second output IF signal being in quadrature relation with said first output IF signal, wherein sources of the transistors (2e-1, 2e-2) of said differential amplifier (2e) are coupled with said second source potential through a third impedance circuit (3c), sources of the transistors of the first differential pair (2a) and sources of the transistors of the third differential pair (2c) are coupled together, coupled with an output of a first transistor (2e-1) of said differential amplifier (2e) and coupled with said second source potential through a first impedance circuit (3a), sources of the transistors of the second differential pair (2b) and sources of the transistors of the fourth differential pair (2d) are coupled together, coupled with an output of a second transistor (2e-2) of said differential amplifier (2e) and coupled with said second source potential through a second impedance circuit (3b), first bias means for providing first bias potential to a gate of each transistor of said differential pairs, and second bias means for providing second bias potential to a gate of each transistor of said differential amplifier independently from said first bias means are provided, each of said impedance circuits has high impedance for operational frequency of the current mixer, and is short-circuited for D.C. current.

2. A quadrature mixer circuit according to claim 1, wherein each of said impedance circuits is implemented by a parallel circuit of a capacitor and an inductor resonating essentially with frequency of said input RF signal and said local signal.

3. A quadrature mixer circuit according to claim 1, wherein each of said impedance circuits is implemented by an inductor.

4. A quadrature mixer circuit according to claim 1, wherein each of said transistors is an NMOS transistor.

5. A quadrature mixer circuit according to claim 1, wherein each of the transistors of said differential amplifier is a PMOS transistor, and each of the transistors of said differential pairs is an NMOS transistor.

6. A quadrature mixer circuit according to claim 1, wherein said RF input signal is in differential form, and is applied to each gate of each transistor of said differential amplifier.

7. A quadrature mixer circuit according to claim 1, wherein said RF input signal is in single-ended form, and is applied to a gate of one of the transistors of the differential amplifier, a gate of the other transistor is coupled with a fixed bias potential (Bias2), and another transistor (M3) with a gate receiving a fixed bias (Bias1) is inserted between sources of the transistors of the differential amplifier and said third impedance circuit.

8. A quadrature mixer circuit according to claim 7, wherein a gate width of said transistor M3 is k times as large as that of the other transistors, and the value k is in the range between 1 and 3.

9. A quadrature mixer circuit according to claim 1, wherein said output of each transistor of said differential amplifier (2e) is coupled with sources of respective differential pairs through a capacitor.

10. A complex mixer circuit comprising;

first, second, third, and fourth differential pairs, each receiving a first local signal (LO2-I) in differential form, fifth, sixth, seventh, and eighth differential pairs, each receiving a second local signal (LO2-Q) in differential form which is in quadrature relation with said first local signal, first, second, third and fourth impedance circuits, each operating as a constant current source, first, second, third and fourth loads, each having the same impedance, a drain of one of the transistors of said first, said second, said seventh and said eighth differential pairs being coupled with a first source potential (VDD) through first and second loads (ZL3, ZL3), respectively, a drain of one of the transistors of said third, said fourth, said fifth and said sixth differential pairs being coupled with said first source potential through third and fourth loads (ZL3, ZL3), respectively, a source of a transistor of said first and said third differential pairs being coupled, and coupled with a second source potential, a source of a transistor of said second and said fourth differential pairs being coupled, and coupled with said second source potential, a source of a transistor of said fifth and said seventh differential pairs being coupled and coupled with said second source potential, a source of a transistor of said sixth and said eighth differential pairs being coupled, and coupled with said second source potential, a first IF output signal (IF-I) in differential form being obtained at a junction of said first load and respective differential pairs, and a junction of said second load and respective differential pairs, a second IF output signal (IF-Q) in differential form having quadrature relation with said first IF output signal being obtained at a junction of said third load and respective differential pairs, and a junction of said fourth load and respective differential pairs, wherein a first RF input signal (RF-I) in differential form is coupled with a junction of said first differential pair and said first impedance circuit, and a junction of said second differential pair and said second impedance circuit, a second RF input signal (RF-Q) in differential form having quadrature relation with said first RF input signal (RF-I) is coupled with a junction of said fifth differential pair and said third impedance circuit, and a junction of said sixth differential pair and said fourth impedance circuit, sources of said first and said third differential pairs are coupled with said second source potential through a first impedance circuit, sources of said second and said fourth differential pairs are coupled with said second source potential through a second impedance circuit, sources of said fifth and said seventh differential pairs are coupled with said second source potential through a third impedance circuit, and sources of said sixth and said eighth differential pairs are coupled with said second source potential through a fourth impedance circuit.

11. A complex mixer circuit according to claim 10, wherein each of said impedance circuits is implemented by a parallel circuit of a capacitor and an inductor resonating essentially with frequency of said input RF signal and said local signal.

12. A complex mixer circuit according to claim 10, wherein each of said impedance circuits is implemented by an inductor.

* * * * *